United States Patent
Tierno et al.

(10) Patent No.: US 6,859,071 B2
(45) Date of Patent: Feb. 22, 2005

(54) PSEUDOFOOTER CIRCUIT FOR DYNAMIC CMOS (COMPLEMENTARY METAL-OXIDE-SEMICONDUCTOR) LOGIC

(75) Inventors: Jose A. Tierno, Austin, TX (US); Sergey V. Rylov, White Plains, NY (US); Alexander Rylyakov, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 10/314,962

(22) Filed: Dec. 10, 2002

(65) Prior Publication Data

US 2004/0108873 A1 Jun. 10, 2004

(51) Int. Cl.$^7$ .............................................. H03K 19/096
(52) U.S. Cl. ...................................... 326/95; 326/115
(58) Field of Search ............................ 326/83, 86, 95, 326/97, 98, 115

(56) References Cited

U.S. PATENT DOCUMENTS

| | | | | |
|---|---|---|---|---|
| 4,843,261 A | * | 6/1989 | Chappell et al. | 326/108 |
| 5,440,243 A | * | 8/1995 | Lyon | 326/33 |
| 5,719,818 A | * | 2/1998 | Tovim et al. | 365/230.06 |

* cited by examiner

Primary Examiner—Daniel D. Chang
(74) Attorney, Agent, or Firm—Thu Ann Dang, Esq.; McGinn & Gibb, PLLC

(57) ABSTRACT

A pseudofooter circuit for a logic circuit includes a first FET (Field Effect Transistor) having a first source, a first drain, and a first gate, and a second FET having a second source, a second drain, and a second gate. The first source is connected to the second drain to become a first signal node. The first signal node is connected to at least one gate of an FET in the logic circuit. The first gate is connected to the second gate to become a second signal node receiving a second signal as an input signal. The second source is connected to ground. The first drain becomes a third signal node receiving a third signal as an input signal.

20 Claims, 2 Drawing Sheets

PSEUDOFOOTER CIRCUIT FOR DYNAMIC CMOS (COMPLEMENTARY METAL-OXIDE-SEMICONDUCTOR) LOGIC

BACKGROUND OF THE INVENTION

1. Field of the Invention

The present invention generally relates to increasing speed and reducing the height of a logic circuit stack, such as an NMOS (n-channel metal-oxide-semiconductor) logic circuit stack or a PMOS (p-channel metal-oxide-semiconductor) logic circuit stack, by removing a conventional footer circuit from the stack and using one of the parameters from the stack to enable the relocated footer.

2. Description of the Related Art

Dynamic CMOS (complementary metal-oxide-semiconductor) logic achieves higher performance than straight CMOS logic by precharging the output node of the gates and subsequently discharging it when the logic function to be computed requires it. Through this scheme, only n-type FETs (field effect transistors) are needed to compute the logical function. Since n-type FETs are inherently faster than p-type FETs, there is a speed advantage. However, this speed advantage comes with a cost since extra transistors must be added to the logic function to properly time the precharge and computation operations.

FIG. 1 shows a dynamic logic gate that uses inputs A, B, and C to compute the logic function A*(B+C). FET 101 is used to precharge the output node to a low voltage. FET 102 is used to prevent the evaluation of the output node during precharge and is called a "footer device".

FIG. 2 shows a similar circuit with separate compute and precharge signals. It is advantageous to separate these two signals in multi-phase domino logic and asynchronous logic design styles.

Dynamic logic is very efficient as long as one can implement complex boolean functions in each gate. The complexity of the gate is determined by the highest stack of n-type FETs in the pulldown network (FETs 108, 109, 110, and 111 in FIG. 2) that can safely be used. For current CMOS technology, that height is about three or four FETs, one of which is the computation FET (i.e., the footer). The delay through the gate also increases very rapidly with the height of the pull-down stack. This is a problem.

SUMMARY OF THE INVENTION

In view of the foregoing problems, drawbacks, and disadvantages of the conventional systems, it is a purpose of the present invention to reduce the height of the pull-down stack in a dynamic logic gate without changing the functionality of the gate, thus increasing the speed of such gate.

It is another purpose of the present invention to teach a pseudofooter circuit for a dynamic logic circuit in which one of the input parameters of the dynamic logic circuit is used to enable an FET and the gate of that FET is controlled by a COMPUTE signal that is intended to enable the dynamic logic circuit computation.

It is another purpose of the present invention to teach various configurations of a pseudofooter circuit, including one in which the output signal of the pseudofooter circuit is predictable under conditions when the input parameter has a LOW value and the COMPUTE signal is HIGH.

It is another purpose of the present invention to teach various configurations of a pseudofooter circuit, including one in which the COMPUTE signal has the same polarity as a PRECHARGE signal for the logic circuit.

Accordingly, in a first aspect of the present invention, a pseudofooter circuit for a logic circuit includes a first FET (Field Effect Transistor) having a first source, a first drain, and a first gate, and a second FET having a second source, a second drain, and a second gate. The first source is connected to the second drain to become a first signal node. The first signal node is connected to at least one gate of an FET in the logic circuit. The first gate is connected to the second gate to become a second signal node receiving a second signal as an input signal. The second source is connected to ground. The first drain becomes a third signal node receiving a third signal as an input signal.

In a second aspect of the present invention, described herein is a dynamic CMOS (complementary metal-oxide-semiconductor) logic circuit, including a precharge circuit with a first node connected to a power source, a logic circuit output node connected to a second node of the precharge circuit, a logic circuit controlling the logic circuit output node by computing a logic function based on a plurality of input parameter signals, each controlling a respective gate of an FET (Field Effect Transistor) in the logic circuit, and a pseudofooter circuit. The pseudofooter circuit includes a first FET (Field Effect Transistor) having a first source, a first drain, and a first gate, and a second FET having a second source, a second drain, and a second gate. The first source is connected to the second drain to become a first signal node. The first signal node is connected to the selected layer to become the at least one input parameter to the selected layer. The first gate is connected to the second gate to become a second signal node receiving a second signal as an input signal. The second source is connected to ground. The first drain becomes a third signal node receiving a third signal as an input signal.

In a third aspect of the present invention, described herein is a method of enabling a logic circuit having a single type of FETs (Field Effect Transistors), the logic circuit executing a logic function as based on a plurality of input parameter signals, the logic circuit having at least two layers of stacked logic, the method including selecting one of the at least two layers to be used as an enable function for the logic circuit, where the selected layer has at least one input parameter for said logic circuit. A pseudofooter circuit provides the at least one input parameter to the selected layer, and the pseudofooter circuit includes a first FET (Field Effect Transistor) having a first source, a first drain, and a first gate, and a second FET having a second source, a second drain, and a second gate. The first source is connected to the second drain to become a first signal node. The first signal node is connected to the selected layer to become the at least one input parameter to the selected layer. The first gate is connected to the second gate to become a second signal node receiving a second signal as an input signal. The second source is connected to ground. The first drain becomes a third signal node receiving a third signal as an input signal.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 3:
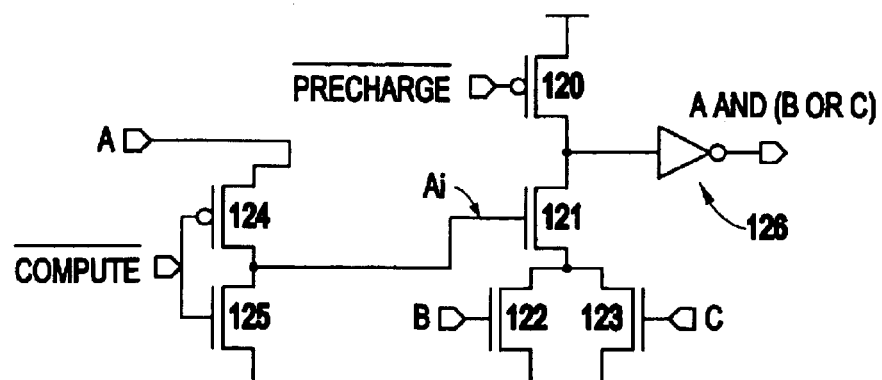
FIG. 3 shows a first embodiment of the present invention.

Referring now to the drawings, and more particularly to FIG. 3, there are shown preferred embodiments of the method and structures according to the present invention. Three specific different circuits are described herein, but one of ordinary skill in the art would readily recognize that there are many variants once this disclosure has been read and understood.

It is also noted that, although NMOS transistors are used in the circuits illustrated, one of ordinary skill in the art would readily be able to adapt the technique described herein in a corresponding PMOS logic circuit. It is also noted that the specific logic circuit used to teach the present invention is only an example of one possible logic circuit. It would be obvious that any logic function that could be implemented in a stack of NMOS or a stack of PMOS transistors could be easily modified to incorporate the present invention.

The exemplary first embodiment shown in FIG. 3 is a first example of a pseudofooter device, comprising FETs 124 and 125. The pseudofooter operates as follows.

When COMPUTE' is high, node Ai is pulled low and FET 121 acts as a footer device. When COMPUTE' is low, FET 124 transmits the value of input A to Ai, and the gate evaluates normally. It is noted that the height of the pull-down stack has been reduced by one FET by removing the conventional footer from the stack and using input parameter A to enable the relocated footer to produce the pseudofooter.

If COMPUTE' is ready before input A, there is very little impact of the pseudofooter on the delay of the gate since FET 124 is working in pass-gate mode. When COMPUTE' is ready after input A is ready, there is some impact on the delay of the gate because of the delay through the inverter formed by FETs 124 and 125. So the circuit of FIG. 3 operates more optimally with stacks of three or more.

One disadvantage of the circuit shown in FIG. 3 is that node Ai is not strongly pulled when COMPUTE is high and A is low. If this state were to last a long time, node Ai could drift up to a p-type FET's threshold voltage. Under these conditions, FET 121 becomes weakly ON, and the result of the evaluation is unpredictable. To prevent this scenario, as shown in FIG. 4, FET 136 and inverter 137 are added.

That is, when COMPUTE' is low, inverter 137 provides a strong signal to turn FET 136 ON, thereby connecting the LOW on A to Ai.

Figure 1:
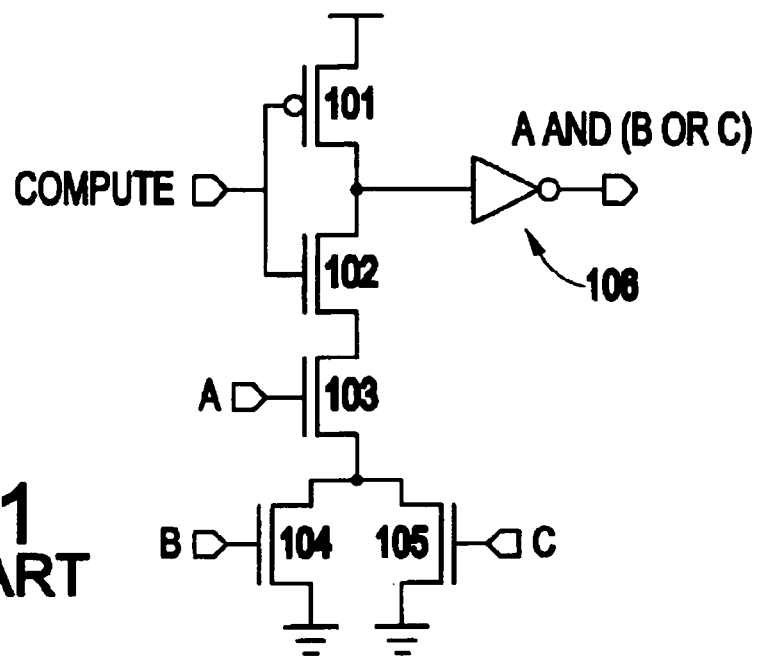
FIG. 1 shows a prior art dynamic logic gate.
Figure 2:
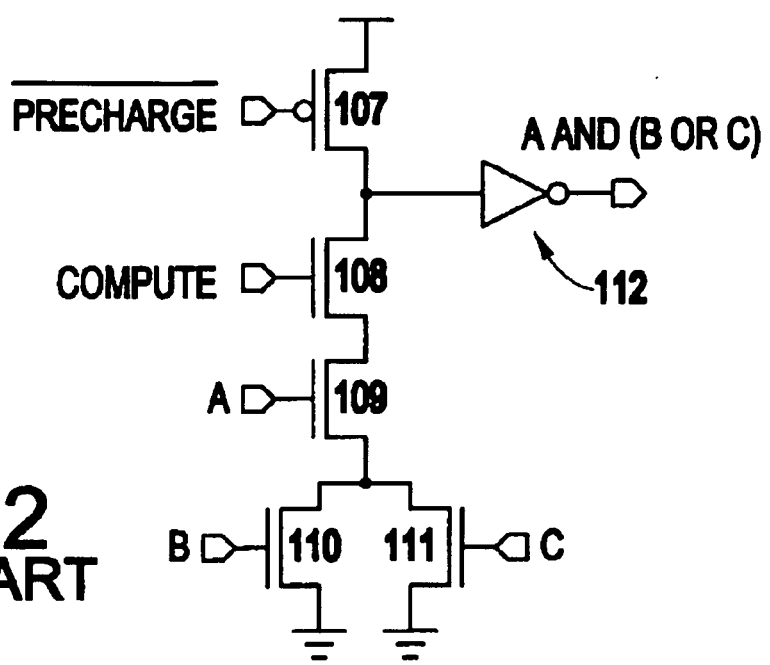
FIG. 2 shows a prior art dynamic logic gate with a separate precharge circuit.
Figure 4:
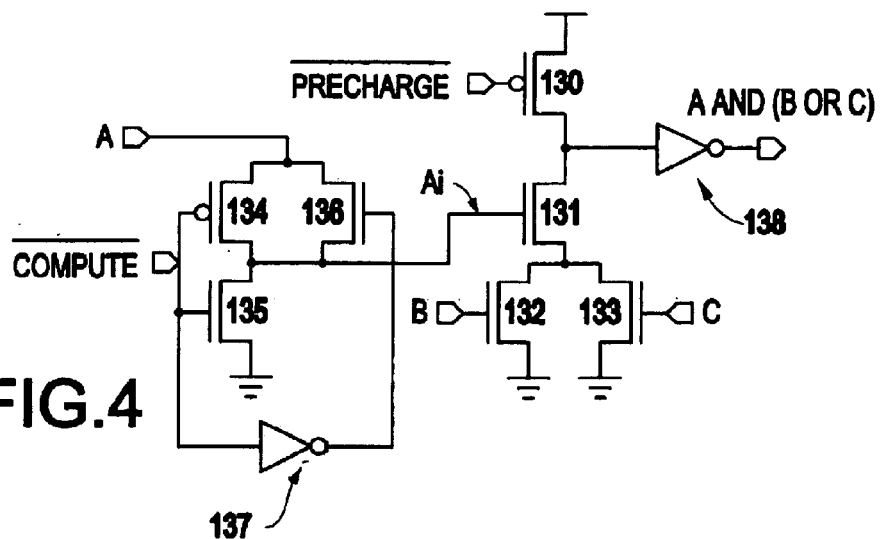
FIG. 4 shows a second embodiment of the present invention.

It is noted that a problem with the circuits of FIGS. 3 and 4 is that the signals COMPUTE' and PRECHARGE' have different polarities. That is, they cannot be connected together, as is done in FIG. 1.

Figure 5:
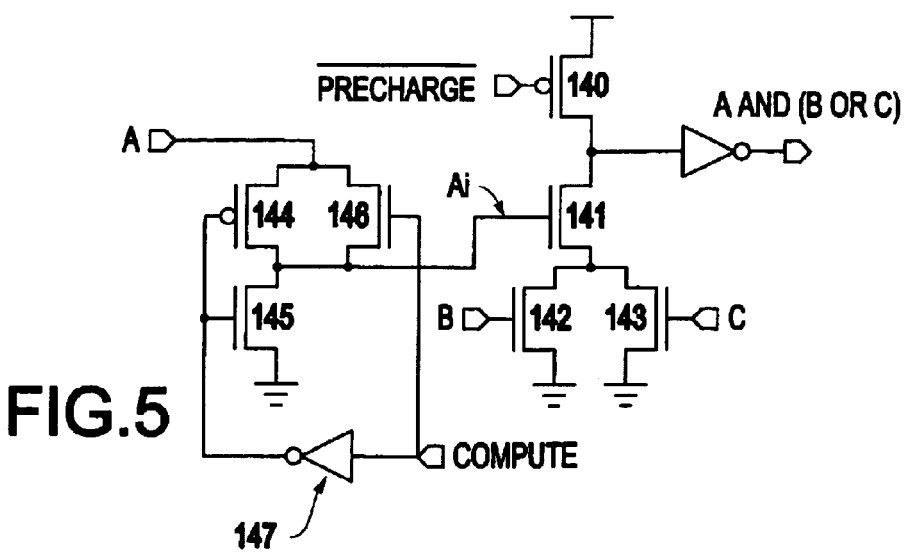
FIG. 5 shows a third embodiment of the present invention.

FIG. 5 shows an exemplary solution, where the pseudofooter has been switched around so that both signals have the same polarity. This exemplary pseudofooter is the fastest in the evaluate phase, where COMPUTE goes from low to high. But it is somewhat slower in the precharge phase, where a time delay exists for signals to propagate through inverter 147 and FET 145 before FET 141 gets turned off.

The three examples discussed above provide sufficient basis to generalize the technique. As mentioned earlier, there is no reason to limit the logic circuit as being NMOS as per these three examples, since it would be easy to modify a stack of PMOS logic.

In order to generalize the technique above, a key is to select an entire level in the logic stack from which input parameters will be used to enable a relocated footer in the manner shown in one of FIGS. 3 through 5. In the examples of the present invention, the easiest parameter to extract from the stack would be "A" since it is ANDed with (B+C).

That is, the stack level having the single parameter "A" is obviously the more efficient choice.

As the alternative for the logic circuit A*(B+C), the level performing the OR function (B+C) could have been selected. However, in this alternative, two parameters B, C are involved in an OR function. Therefore, either two pseudofooters in parallel would have to be implemented, one using parameter B for enablement and one using parameter C for enablement, or one pseudofooter could be enabled by (A+B).

The generalization of the technique demonstrated by FIGS. 3 through 5 is straightforward from the discussion above. That is, one layer of the logic stack is selected as having parameters to use to enable the pseudofooter device, and preferably the layer selection will be based on a determination of which layer would be most efficient. In evaluating efficiency, one would look for a layer that provides an AND function that controls the stack or an OR function-layer having the smallest number of parameters in that layer of the stack.

The present invention provides a number of benefits. First, it provides faster dynamic logic gates. The present invention also permits construction of more complex dynamic logic gates. That is, if the practical limit for the height of the stack is n, a gate with n AND terms, rather than just n−1, can be constructed by using the technique of the present invention. Third, the present invention permits lower-power dynamic logic gates, since all the transistors can be slightly smaller because of the reduced stack height.

The present invention is applicable in various environments. For example, it can be used in full custom digital design by offering one more choices of implementation to the digital gate designer. It also provides a benefit for ASIC (application specific integrated circuit) digital design, where the gates extended in the manner of the present invention can be incorporated in the design library and used with the same care necessary for dynamic logic design.

While the the invention has been described in terms of a several preferred embodiments, those skilled in the art will recognize that the invention can be practiced with modification within the spirit and scope of the appended claims.

Further, it is noted that, Applicants' intent is to encompass equivalents of all claim elements, even if amended later during prosecution.

Having thus described our invention, what we claim as new and desire to secure by Letters Patent is as follows:

1. A pseudofooter circuit for a logic circuit, said pseudofooter circuit comprising:
   a first FET (Field Effect Transistor) having a first source, a first drain, and a first gate; and
   a second FET having a second source, a second drain, and a second gate,
   wherein said first source is connected to said second drain to comprise a first signal node, said first signal node being connected to at least one gate of an FET in said logic circuit to be a logic input signal into said logic circuit, said first gate is connected to said second gate to comprise a second signal node receiving a second signal as an input signal related to said logic circuit, said second source is connected to ground, said first drain comprises a third signal node receiving a third signal as an input signal, said third signal being a logic signal used in a logic function executed by said logic circuit.

2. The pseudofooter circuit of claim 1, wherein said second signal comprises a logic circuit COMPUTE enable signal and said third signal comprises a signal used as a logic parameter in said logic circuit.

3. The pseudofooter circuit of claim 1, wherein said first FET comprises a p-channel FET and said second FET comprises an n-channel FET.

4. A pseudofooter circuit for a logic circuit, comprising:
a first FET (Field Effect Transistor) having a first source, a first drain, and a first gate;
a second FET having a second source, a second drain, and a second gate,
wherein said first source is connected to said second drain to comprise a first signal node, said first signal node being connected to at least one gate of an FET in said logic circuit, said first gate is connected to said second gate to comprise a second signal node receiving a second signal as an input signal, said second source is connected to ground, said first drain comprises a third signal node receiving a third signal as an input signal;
a third FET having a drain connected to said first drain and a source connected to said first source; and
an inverter coupled to a gate of said third FET.

5. The pseudofooter circuit of claim 4, wherein an input node of said inverter is connected to said first gate and said second gate and an output node of said inverter is connected to a gate of said third FET.

6. The pseudofooter circuit of claim 4, wherein an input node of said inverter is connected to a gate of said third FET and said input node of said inverter receives said second signal, and an output node of said inverter is connected to said first gate and said second gate.

7. A dynamic CMOS (complementary metal-oxide-semiconductor) logic circuit, comprising:
a precharge circuit with a first node connected to a power source;
a logic circuit output node, said output node connected to a second node of said precharge circuit;
a logic circuit controlling said logic circuit output node by computing a logic function based on a plurality of input parameter signals, each controlling a respective gate of an FET (Field Effect Transistor) in said logic circuit; and
a pseudofooter circuit providing a logic signal input into said logic circuit, said pseudofooter circuit comprising:
a first FET (Field Effect Transistor) having a first source, a first drain, and a first gate; and
a second FET having a second source, a second drain, and a second gate,
wherein said first source is connected to said second drain to comprise a first signal node, said first signal node being connected to become one of said plurality of input parameter signals of said logic circuit, said first gate is connected to said second gate to comprise a second signal node receiving a second signal as an input signal, said second source is connected to ground, said first drain comprises a third signal node receiving a third signal as an input signal.

8. The dynamic CMOS logic circuit of claim 7, wherein said second signal comprises a COMPUTE enable signal for said logic circuit and said third signal comprises one of said plurality of input parameter signals.

9. The dynamic CMOS logic circuit of claim 7, wherein said logic circuit comprises NMOS (n-channel metal-oxide-semiconductor) FETs, said precharge circuit comprises a PMOS (p-channel metal-oxide-semiconductor) FET, said first FET in said pseudofooter circuit comprises a PMOS FET, and said second FET in said pseudofooter circuit comprises an NMOS FET.

10. The dynamic CMOS circuit of claim 9, further comprising:
an inverter connected to said logic circuit output node.

11. The dynamic CMOS circuit of claim 9, said pseudofooter circuit further comprising:
a second NMOS FET having a drain connected to said drain of said pseudofooter circuit PMOS FET and a source connected to said source of said pseudofooter circuit PMOS FET; and
an inverter.

12. The dynamic CMOS circuit of claim 11, wherein said pseudofooter inverter is connected to receive said second signal and an output of said pseudofooter inverter is connected to a gate of said second NMOS FET in said pseudofooter circuit.

13. The dynamic CMOS circuit of claim 11, wherein a gate of said second NMOS FET in said pseudofooter circuit and said pseudofooter inverter receives an input signal and an output of said pseudofooter inverter is connected to provide said second signal.

14. A method of enabling a logic circuit comprising a single type of FETs (Field Effect Transistors), said logic circuit executing a logic function based on a plurality of input parameter signals, said logic circuit having at least two layers of stacked logic, said method comprising:
selecting one of said at least two layers to be used as an enable function for said logic circuit, said selected layer having at least one input parameter used to define a logic function solved by said logic circuit; and
providing a pseudofooter circuit to provide said at least one input parameter to said selected layer, said pseudofooter circuit comprising:
a first FET (Field Effect Transistor) having a first source, a first drain, and a first gate; and
a second FET having a second source, a second drain, and a second gate,
wherein said first source is connected to said second drain to comprise a first signal node, said first signal node being connected to said selected layer to become said at least one input parameter to said selected layer, said first gate is connected to said second gate to comprise a second signal node receiving a second signal as an input signal, said second source being connected to ground, said first drain comprises a third signal node receiving a third signal as an input signal.

15. The method of claim 14, wherein said second signal comprises a COMPUTE enable signal for said logic circuit and said third signal comprises an input signal for use as said at least one input parameter to said selected layer.

16. The method of claim 14, wherein said single-type of FETs comprises NMOS FETs, said first FET in said pseudofooter circuit comprises a PMOS FET, and said second FET in said pseudofooter circuit comprises an NMOS FET.

17. The method of claim 16, wherein said pseudofooter circuit further comprises:
a second NMOS FET having a drain connected to said drain of said pseudofooter circuit PMOS FET and a source connected to said source of said pseudofooter circuit PMOS FET; and
an inverter.

18. The method of claim 17, wherein said pseudofooter inverter is connected to receive said first signal and an output of said pseudofooter inverter is connected to a gate of said second NMOS FET in said pseudofooter circuit.

19. The method of claim 17, wherein a gate of said second NMOS FET in said pseudofooter circuit and said pseudofooter inverter receives an input signal and an output of said pseudofooter inverter is connected to provide said second signal.

20. The method of claim 14, wherein said selecting of a layer is based on determining which layer comprises an AND logic function.

* * * * *